(12) United States Patent
Yang et al.

(10) Patent No.: US 10,285,305 B2
(45) Date of Patent: May 7, 2019

(54) WIND TUNNEL AND HEAT DISSIPATING SYSTEM

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Yi-Lin Yang, Wuhan (CN); Chung-Jen Hung, New Taipei (TW); Ching-Jou Chen, New Taipei (TW)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/696,273

(22) Filed: Sep. 6, 2017

(65) Prior Publication Data

US 2018/0343768 A1    Nov. 29, 2018

(30) Foreign Application Priority Data

May 26, 2017 (CN) .......................... 2017 1 0381741

(51) Int. Cl.
  *H05K 7/20* (2006.01)
  *H01L 23/467* (2006.01)
  *H05K 1/18* (2006.01)

(52) U.S. Cl.
  CPC ....... *H05K 7/20145* (2013.01); *H01L 23/467* (2013.01); *H05K 1/181* (2013.01); *H05K 2201/10159* (2013.01)

(58) Field of Classification Search
  CPC .............. H05K 7/20145; H05K 1/181; H05K 2201/10159; H01L 23/467
  USPC ........................................................ 361/692
  See application file for complete search history.

(56) References Cited

U.S. PATENT DOCUMENTS

| | | | |
|---|---|---|---|
| 5,597,035 A * | 1/1997 | Smith ....................... | G06F 1/20 165/147 |
| 6,031,720 A * | 2/2000 | Crane, Jr. ............. | H01L 23/467 361/695 |
| 7,028,753 B2 * | 4/2006 | Sterner ................... | F28D 15/02 165/121 |
| 7,180,740 B2 * | 2/2007 | Li ......................... | H01L 23/467 165/80.3 |
| 7,310,228 B2 * | 12/2007 | Chen .................. | H05K 7/20154 165/104.33 |
| 7,447,021 B2 * | 11/2008 | Chen ....................... | G06F 1/20 361/679.48 |

(Continued)

*Primary Examiner* — Anatoly Vortman
(74) *Attorney, Agent, or Firm* — ScienBiziP, P.C.

(57) ABSTRACT

A heat dissipating system includes a wind tunnel, a first electronic element, and a second electronic element. The wind tunnel defines a top air inlet channel and a separated bottom, and a top air discharging channel and a separated bottom air discharging channel. Air entering the bottom air inlet channel dissipates heat produced by the first electronic element to the top air discharging channel, to flow out of the wind tunnel. Air entering the top air inlet channel flows to the bottom air discharging channel to dissipate heat produced by the second electronic element, this arrangement avoids heated air from one element being exhausted onto another element.

20 Claims, 7 Drawing Sheets

(56) References Cited

U.S. PATENT DOCUMENTS

| | | | | |
|---|---|---|---|---|
| 7,586,746 B2* | 9/2009 | Liu | ............... | G06F 1/20 |
| | | | | 165/104.33 |
| 7,796,385 B2* | 9/2010 | Yao | ............ | F04D 25/0613 |
| | | | | 361/679.48 |
| 8,068,341 B2* | 11/2011 | Zhang | ............ | G06F 1/20 |
| | | | | 361/679.49 |
| 8,077,459 B2* | 12/2011 | Zhang | ............ | G06F 1/20 |
| | | | | 361/694 |
| 8,081,444 B2* | 12/2011 | Xiao | ............ | G06F 1/20 |
| | | | | 312/223.2 |
| 8,305,752 B2* | 11/2012 | Ke | ............... | G06F 1/20 |
| | | | | 165/80.2 |
| 8,432,686 B2* | 4/2013 | Liu | ............... | G06F 1/20 |
| | | | | 361/679.49 |
| 8,622,790 B2* | 1/2014 | Chou | ............ | F24F 13/00 |
| | | | | 454/184 |

* cited by examiner

WIND TUNNEL AND HEAT DISSIPATING SYSTEM

CROSS-REFERENCE TO RELATED APPLICATIONS

This application claims priority to Chinese Patent Application No. 201710381741.2, filed on May 26, 2017, the contents of which are incorporated by reference herein.

FIELD

The subject matter herein generally relates to heat dissipating systems.

BACKGROUND

Electronic devices include a chassis and electronic elements on the chassis. A wind tunnel covers a first electronic element, for example, a central processing unit. Air at an air inlet of the tunnel is guided to an air outlet to dissipate heat produced by the first electronic element. The heat produced by the first electronic element may be dissipated onto a second electronic element at the air outlet of the tunnel, resulting in higher temperature of the second electronic element. This is not optimal.

BRIEF DESCRIPTION OF THE DRAWINGS

Implementations of the present technology will now be described, by way of example only, with reference to the attached figures.

DETAILED DESCRIPTION

Figure 1:
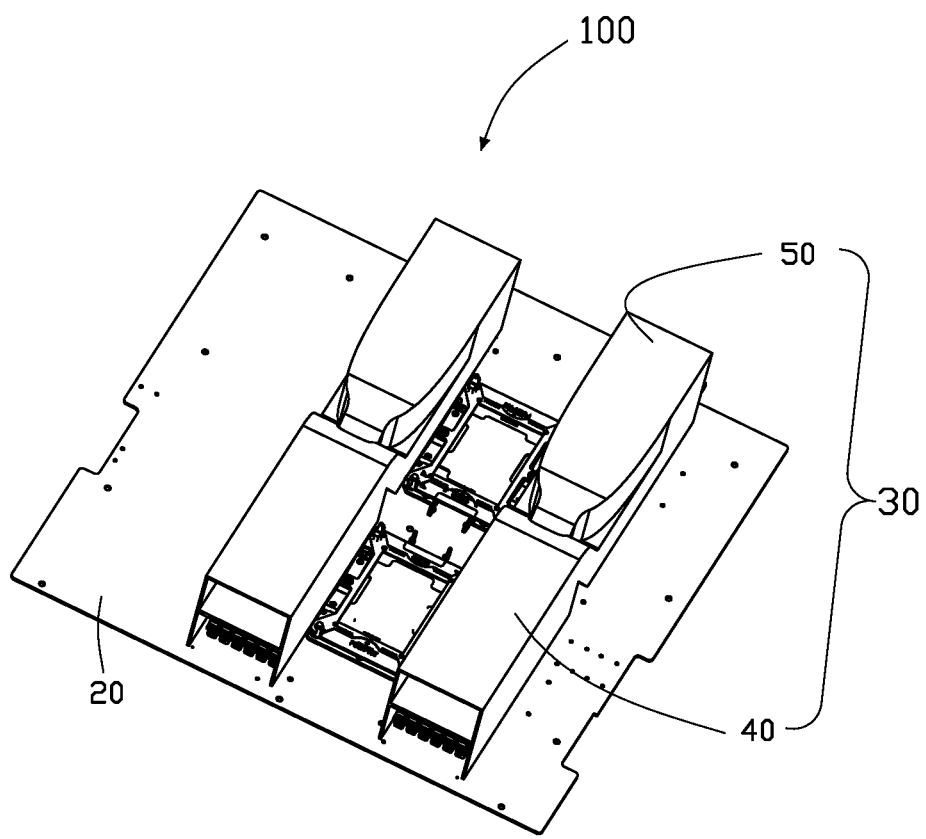
FIG. 1 is an isometric view of an exemplary embodiment of a heat dissipating system.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein. The disclosure is illustrated by way of example and not by way of limitation in the figures of the accompanying drawings, in which like references indicate similar elements. It should be noted that references to "an" or "one" exemplary embodiment in this disclosure are not necessarily to the same exemplary embodiment, and such references mean "at least one."

The term "comprising" means "including, but not necessarily limited to"; it specifically indicates open-ended inclusion or membership in a so-described combination, group, series, and the like.

FIG. 1 illustrates a heat dissipating system 100 including a motherboard 20, a first electronic element 21, a second electronic element 22, a third electronic element 23, a fourth electronic element 24, a fifth electronic element 25, a sixth electronic element 26, and two wind tunnels 30. The first electronic element 21 is distanced from the second electronic element 22. The third electronic element 23 is distanced from the fourth electronic element 24. The fifth electronic element 25 is positioned between the first electronic element 21 and the third electronic element 23. The sixth electronic element 26 is positioned between the second electronic element 22 and the fourth electronic element 24. The first electronic element 21, the second electronic element 22, the third electronic element 23, and the fourth electronic element 24 are four dual-in-line memories. The fifth electronic element 25 and the sixth electronic element 26 are two central processing units.

One of the two wind tunnels 30 is attached to the motherboard 20 and covers the first electronic element 21 and the second electronic element 22. The other wind tunnel 30 <?> is attached to the mother board 20 and covers the third electronic element 23 and the fourth electronic element 24.

Figure 2:
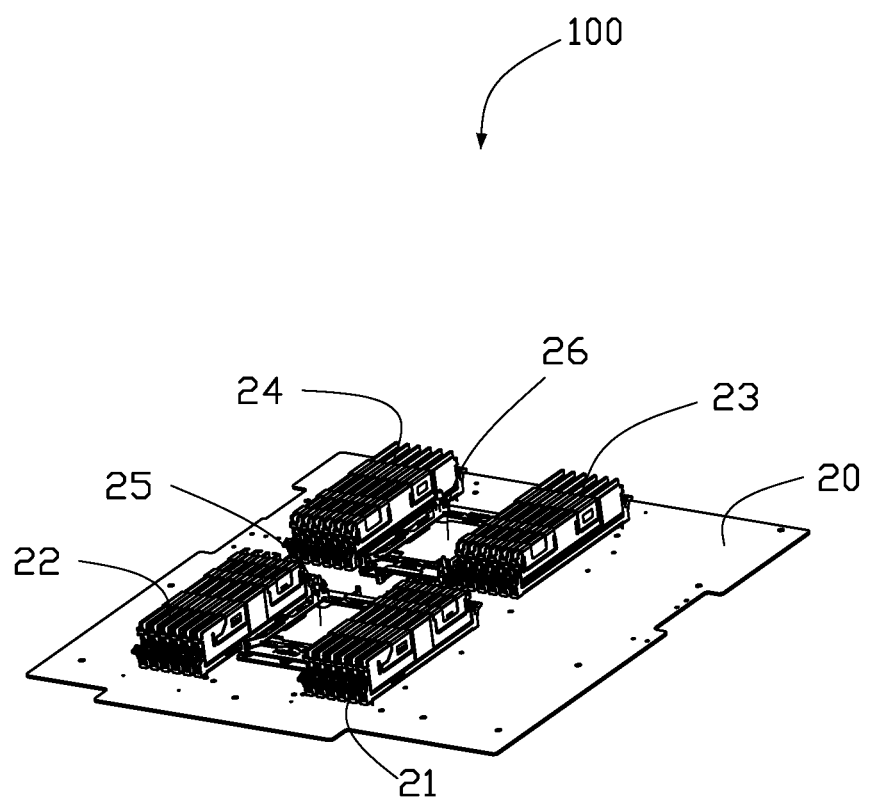
FIG. 2 is similar to FIG. 1, but with a wind tunnel omitted.
Figure 3:
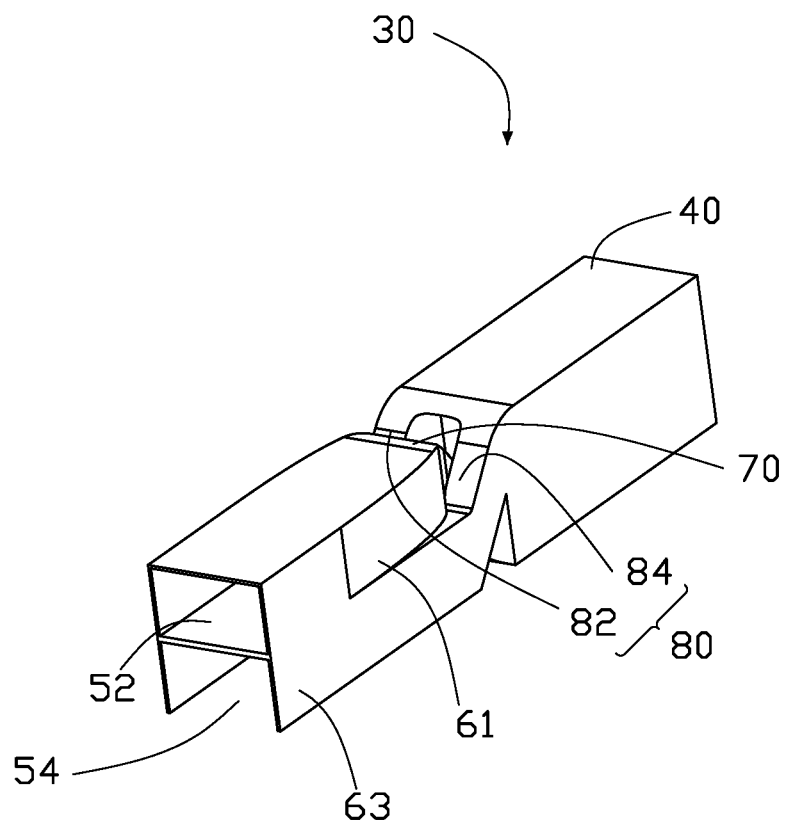
FIG. 3 is an isometric view of a wind tunnel of the heat dissipating system of FIG. 1.
Figure 4:
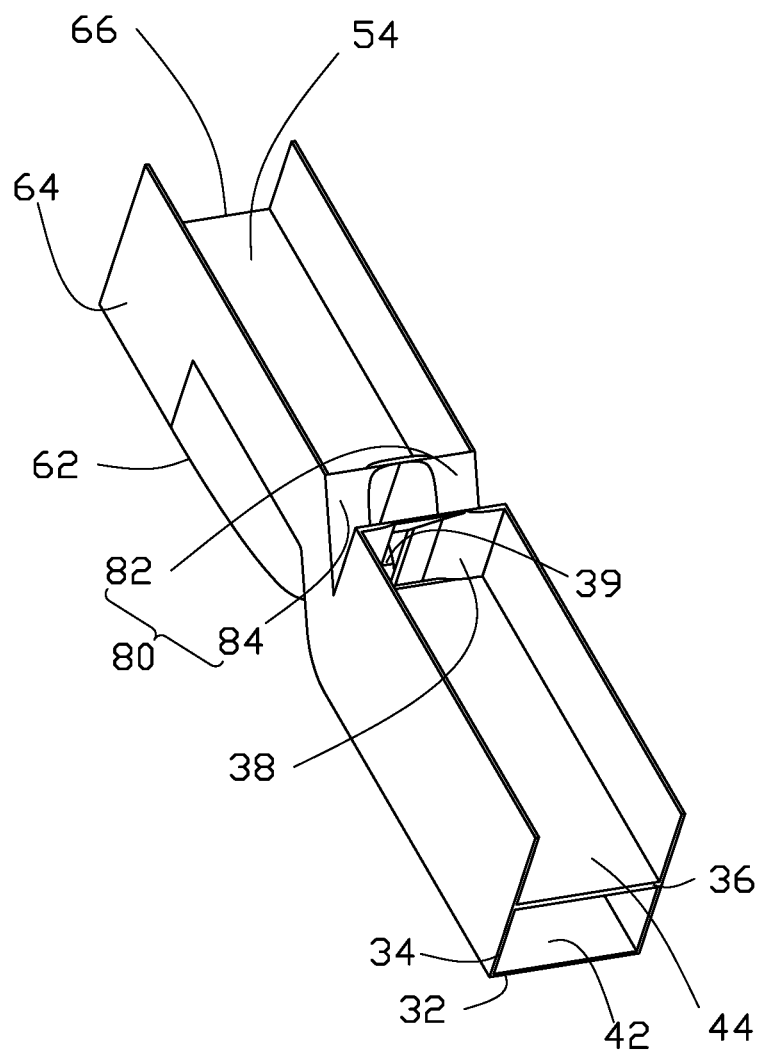
FIG. 4 is similar to FIG. 3, but viewed from a different viewpoint.

FIG. 2 to FIG. 4 illustrates the wind tunnel 30 including a front guiding cover 40, a rear guiding cover 50, a first connecting neck 70, and a second connecting neck 80. The front guiding cover 40 defines a top air inlet channel 42 and a bottom air inlet channel 44 isolated from the air inlet channel 42. The rear guiding cover 50 defines a top air discharging channel 52 and a bottom air discharging channel 54 isolated from the top air discharging channel 52. The first connecting neck 70 connects between the bottom air inlet channel 44 and the top air discharging channel 52. Air entering the bottom air inlet channel 44 flows out of the wind tunnel 30 through the top air discharging channel 52. The second connecting neck 80 connects between the top air inlet channel 42 and the bottom air discharging channel 54. Air entering the top air inlet channel 42 flows out of the wind tunnel 30 through the bottom air discharging channel 54.

The first electronic element 21 is positioned in the bottom air inlet channel 44. The second electronic element 22 is positioned in the bottom air discharging channel 54. The air entering the bottom air inlet channel 44 dissipates heat produced by the first electronic element 21 to the top air discharging channel 52 through the first connecting neck 70, to flow out of the wind tunnel 30. The air entering the top air inlet channel 42 flows to the bottom air discharging channel 54 through the second connecting neck 80 to dissipate heat produced by the second electronic element 22, out of the wind tunnel 30.

The front guiding cover 40 includes a first top plate 32, two first lateral plates 34, and a first partition 36. The two first lateral plates 34 extend at opposite sides of the first top plate 32. The first partition 36 connects the two first lateral plates 34. The top air inlet channel 42 is defined between the first partition 36 and the first top plate 32. The bottom air inlet channel 44 is positioned at a side of the first partition 36 away from the first top plate 32.

The rear guiding cover 50 includes a second top plate 62, two second lateral plates 64, and a second partition 66. The two second lateral plates 64 extend from opposite sides of the second top plate 62. The second partition 66 connects the two second lateral plates 64. The top air discharging channel 52 is defined between the second partition 66 and the second top plate 62. The bottom air discharging channel 54 is positioned at a side of the second partition 66 away from the second top plate 62.

Figure 5:
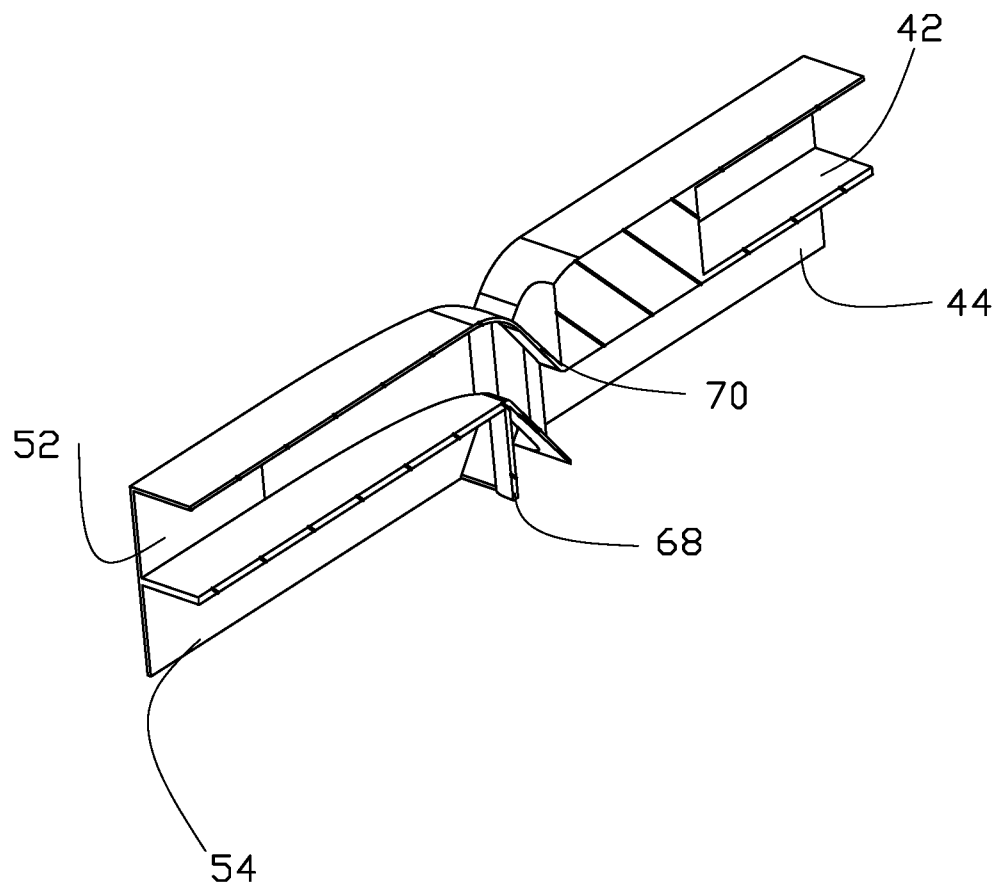
FIG. 5 is a cross-section view of the wind tunnel of FIG. 1 along VI-VI line in FIG. 3.
Figure 6:
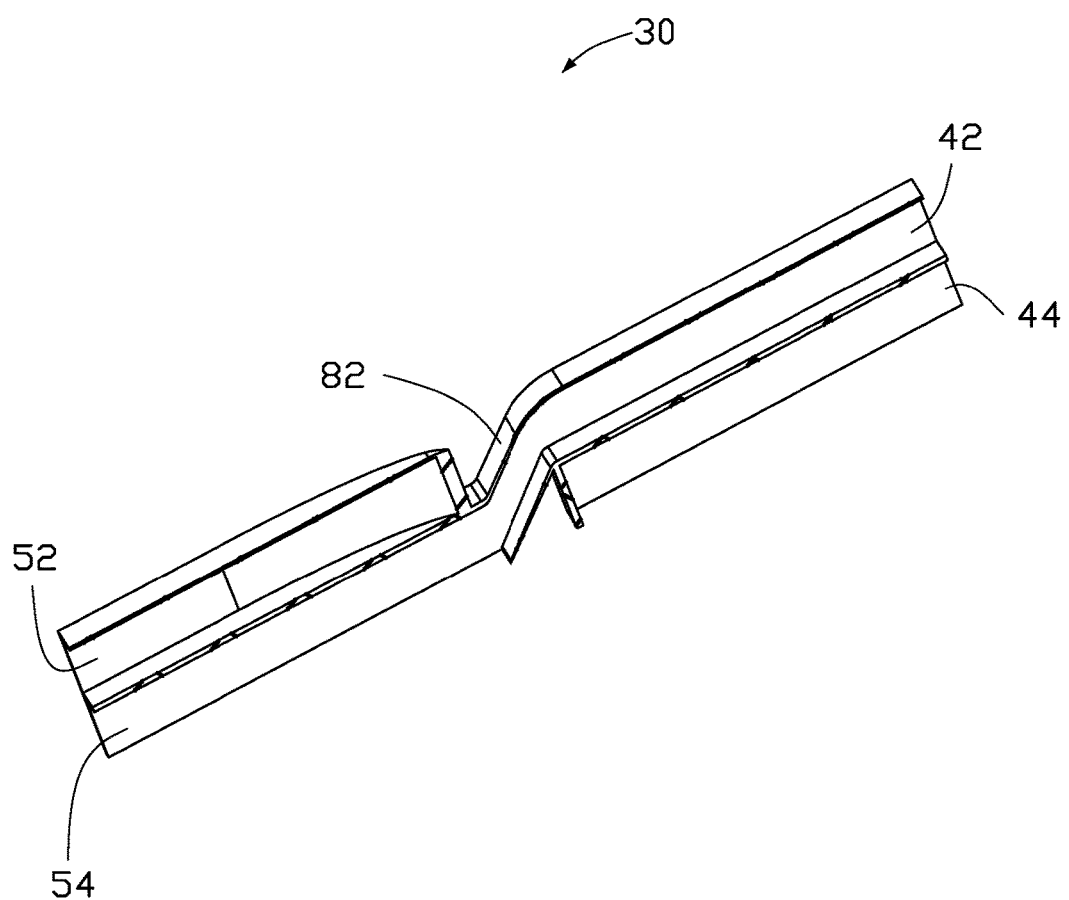
FIG. 6 is a cross-section view of the wind tunnel of FIG. 1 along VII-VII line in FIG. 3.

FIGS. 5-6 illustrates the front guiding cover 40 which further includes a first connecting plate 38. The first connecting plate 38 connects ends of the two first lateral plates 34 adjacent to the second lateral plate 64. The first connecting plate 38 defines a first through hole 39 below the first partition 36. The rear guiding cover 50 further includes a second connecting plate 68. The second connecting plate 38 connects ends of the two second lateral plates 64 adjacent to the first lateral plate 34. The second connecting plate 38 defines a first hole (not labeled) below the first partition 36. The first connecting neck 70 surrounds the first through hole 39 and extends from the first connecting plate 38 up to the second connecting plate 68 to surround the first hole. Thus, the bottom air inlet channel 44 communicates with the top air discharging channel 52.

The second lateral plate 64 includes a top lateral plate 61 and a bottom lateral plate 63. An end of the top lateral plate 61 away from the first lateral plate 34 and the bottom lateral plate 63 are in a same plane. An end of the top lateral plate 61 adjacent to the first lateral plate 34 is positioned at an inner side of the bottom lateral plate 63. The first connecting neck 70 connects to the second partition 66, the second connecting plate 68, and the top lateral plate 61.

The second connecting neck 80 includes a left connecting neck 82 and a right connecting neck 84. The left connecting neck 82 and the right connecting neck 84 connect to the first connecting plate 38 and are positioned at two sides of the first connecting neck 70. The left connecting neck 82 and the right connecting neck 84 connect to the second partition 66, the second connecting plate 68, and the bottom lateral plate 63. The first connecting plate 38 further defines two second through holes (not labeled) above the first partition 36. The second connecting plate 68 further defines two second holes (not labeled) below the second partition 66. The left connecting neck 82 and the right connecting neck 84 surround the two second through holes and extend from the first connecting plate 38 down to the second connecting plate 68 to surround the two second holes. Thus, the top air inlet channel 42 communicates to the bottom air discharging channel 54.

Figure 7:
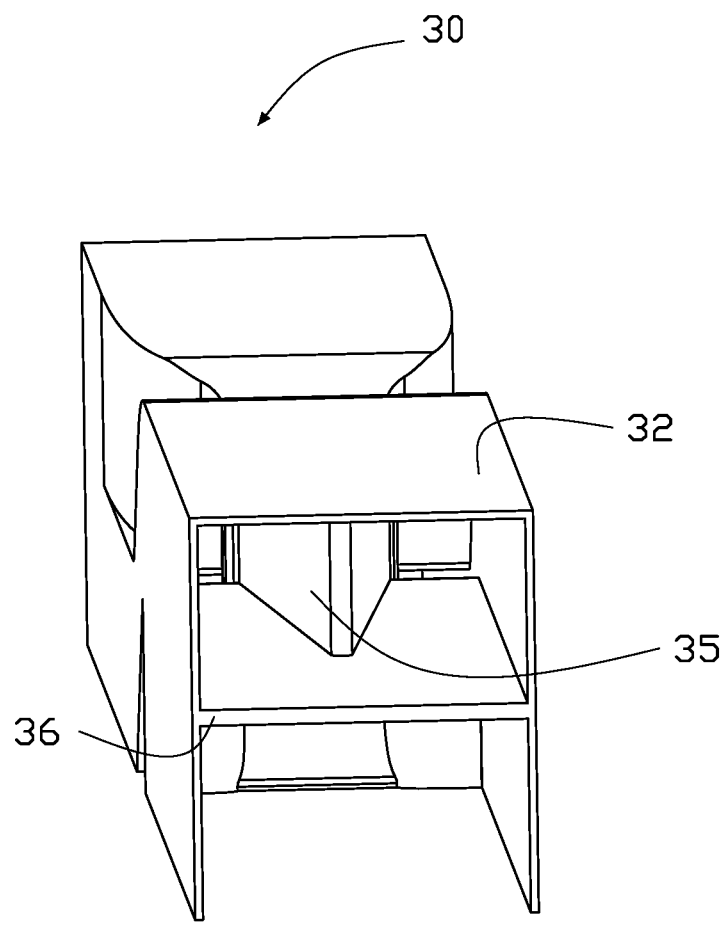
FIG. 7 is similar to FIG. 3, but viewed from a different viewpoint.

FIG. 7 illustrates a guiding plate 35 fixed between the first partition 36 and the first top plate 32. A projection of the guiding plate 35 on the first partition 36 is "V" shaped. An opening of the "V" faces the first connecting plate 38. The guiding plate 35 guides the air entering to the top air inlet channel 42 to the left connecting neck 82 and the right connecting neck 84.

The exemplary embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A wind tunnel comprising:
    a front guiding cover defining a top air inlet channel and a bottom air inlet channel isolated from the top air inlet channel;
    a rear guiding cover defining a top air discharging channel and a bottom air discharging channel isolated from the top air discharging channel;
    a first connecting neck connected between the bottom air inlet channel and the top air discharging channel, air entered to the bottom air inlet channel flowing out of the wind tunnel through the top air discharging channel; and
    a second connecting neck connected between the top air inlet channel and the bottom air discharging channel, air entered to the top air inlet channel flowing out of the wind tunnel through the bottom air discharging channel.

2. The wind tunnel as claimed in claim 1, wherein the front guiding cover comprises a first top plate, two first lateral plates and a first partition, the two first lateral plates extend from opposite sides of the first top plate, the first partition connects between the two first lateral plates, the top air inlet channel is defined between the first partition and the first top plate, the bottom air inlet channel is positioned at a side of the first partition away from the first top plate.

3. The wind tunnel as claimed in claim 2, wherein the rear guiding cover comprises a second top plate, two second lateral plates and a second partition, the two second lateral plates extend from opposite sides of the second top plate, the second partition connects between the two second lateral plates, the top air discharging channel is defined between the second partition and the second top plate, the bottom air discharging channel is positioned at a side of the second partition away from the second top plate.

4. The wind tunnel as claimed in claim 3, wherein the front guiding cover further comprises a first connecting plate connected to ends of the two first lateral plates adjacent to the two second lateral plates, the first connecting plate defines a first through hole below the first partition, the rear guiding cover further comprises a second connecting plate connected to ends of the two second lateral plates adjacent to the two first lateral plates, the second connecting plate defines a first hole below the second partition, the first connecting neck surrounds the first through hole and extends from the first connecting plate upward the second connecting plate to surround the first hole.

5. The wind tunnel as claimed in claim 4, wherein each second lateral plate comprises a top lateral plate and a bottom lateral plate, an end of the top lateral plate away from the first lateral plate and the bottom lateral plate are in a same plane, an end of the top lateral plate adjacent to the first lateral plate is positioned at an inner side of the bottom lateral plate.

6. The wind tunnel as claimed in claim 5, wherein the first connecting neck connects to the second partition, the second connecting plate and the top lateral plate.

7. The wind tunnel as claimed in claim 5, wherein the second connecting neck comprises a left connecting neck and a right connecting neck, the left connecting neck and the right connecting neck connect to the first connecting plate and are positioned at two sides of the first connecting neck, the left connecting neck and the right connecting neck connect to the second partition, the second connecting plate and the bottom lateral plate, the first connecting plate further defines two second through holes above the first partition, the second connecting plate further defines two second holes below the second partition, the left connecting neck and the right connecting neck surrounds the two second through holes and extend from the first connecting plate downward the second connecting plate to surround the two second holes.

8. The wind tunnel as claimed in claim 7, wherein a guiding plate fixed between the first partition and the first top plate, the guiding plate guides the air entering to the top air inlet channel to the left connecting neck and the right connecting neck.

9. The wind tunnel as claimed in claim 8, wherein the projection of the guiding plate on the first partition is "V" shaped, an opening of the "V" faces the first connecting plate.

10. A heat dissipating system comprising:
   at least one wind tunnel comprising:
      a front guiding cover defining a top air inlet channel and a bottom air inlet channel isolated from the top air inlet channel;
      a rear guiding cover defining a top air discharging channel and a bottom air discharging channel isolated from the top air discharging channel;
      a first connecting neck connected between the bottom air inlet channel and the top air discharging channel; and
      a second connecting neck connected between the top air inlet channel and the bottom air discharging channel;
   a first electronic element positioned in the bottom air inlet channel; and
   a second electronic element positioned in the bottom air discharging channel;
   wherein air entered to the bottom air inlet channel dissipates heat produced by the first electronic element to the top air discharging channel through the first connecting neck to flow out of the wind tunnel, air entered to the top air inlet channel flows to the bottom air discharging channel through the second connecting neck to dissipate heat produced by the second electronic element out of the wind tunnel.

11. The heat dissipating system as claimed in claim 10, wherein the first electronic element and the second electronic element are two dual-in-line memories.

12. The heat dissipating system as claimed in claim 10, wherein the heat dissipating system comprises two wind tunnels and further comprises a third electronic element, a fourth electronic element, a fifth electronic element and a sixth electronic element, the fifth electronic element is positioned between the first electronic element and the third electronic element, the sixth electronic element is positioned between the second electronic element and the fourth electronic element, the fifth electronic element and the sixth electronic element are two central processing units, one of the two wind tunnels covers the first electronic element and the second electronic element, the other wind tunnel covers the third electronic element and the fourth electronic element.

13. The heat dissipating system as claimed in claim 10, wherein the front guiding cover comprises a first top plate, two first lateral plates and a first partition, the two first lateral plates extend from opposite sides of the first top plate, the first partition connects between the two first lateral plates, the top air inlet channel is defined between the first partition and the first top plate, the bottom air inlet channel is positioned at a side of the first partition away from the first top plate.

14. The wind tunnel as claimed in claim 13, wherein the rear guiding cover comprises a second top plate, two second lateral plates and a second partition, the two second lateral plates extend from opposite sides of the second top plate, the second partition connects between the two second lateral plates, the top air discharging channel is defined between the second partition and the second top plate, the bottom air discharging channel is positioned at a side of the second partition away from the second top plate.

15. The wind tunnel as claimed in claim 14, wherein the front guiding cover further comprises a first connecting plate connected to ends of the two first lateral plates adjacent to the two second lateral plates, the first connecting plate defines a first through hole below the first partition, the rear guiding cover further comprises a second connecting plate connected to ends of the two second lateral plates adjacent to the two first lateral plates, the second connecting plate defines a first hole below the first partition, the first connecting neck surrounds the first through hole and extends from the first connecting plate upward the second connecting plate to surround the first hole.

16. The wind tunnel as claimed in claim 15, wherein each second lateral plate comprises a top lateral plate and a bottom lateral plate, an end of the top lateral plate away from the first lateral plate and the bottom lateral plate are in a same plane, an end of the top lateral plate adjacent to the first lateral plate is positioned at an inner side of the bottom lateral plate.

17. The wind tunnel as claimed in claim 16, wherein the first connecting neck connects to the second partition, the second connecting plate and the top lateral plate.

18. The wind tunnel as claimed in claim 16, wherein the second connecting neck comprises a left connecting neck and a right connecting neck, the left connecting neck and the right connecting neck connect to the first connecting plate and are positioned at two sides of the first connecting neck, the left connecting neck and the right connecting neck connect to the second partition, the second connecting plate and the bottom lateral plate, the first connecting plate further defines two second through holes above the first partition, the second connecting plate further defines two second holes below the second partition, the left connecting neck and the right connecting neck surrounds the two second through holes and extend from the first connecting plate downward the second connecting plate to surround the two second holes.

19. The wind tunnel as claimed in claim 18, wherein a guiding plate fixed between the first partition and the first top plate, the guiding plate guides the air entering to the top air inlet channel to the left connecting neck and the right connecting neck.

20. The wind tunnel as claimed in claim 19, wherein the projection of the guiding plate on the first partition is "V" shaped, an opening of the "V" faces the first connecting plate.

* * * * *